US006548750B1

(12) United States Patent
Picone

(10) Patent No.: US 6,548,750 B1
(45) Date of Patent: Apr. 15, 2003

(54) SOLID STATE THERMOELECTRIC DEVICE

(75) Inventor: Vincenzo Picone, Cantù (IT)

(73) Assignee: Peltech S.R.L., Milan (IT)

(*) Notice: Subject to any disclaimer, the term of this patent is extended or adjusted under 35 U.S.C. 154(b) by 0 days.

(21) Appl. No.: 09/889,551
(22) PCT Filed: Feb. 18, 2000
(86) PCT No.: PCT/IT00/00050
§ 371 (c)(1),
(2), (4) Date: Jul. 19, 2001
(87) PCT Pub. No.: WO00/49664
PCT Pub. Date: Aug. 24, 2000

(51) Int. Cl.⁷ .............................................. H01L 35/28
(52) U.S. Cl. ..................... 136/203; 136/204; 136/210; 136/212
(58) Field of Search ................................ 136/203, 204, 136/205, 208, 209, 210, 211, 212, 230, 242, 225

(56) References Cited

U.S. PATENT DOCUMENTS

| 3,097,027 A | 7/1963 | Mims et al. | 308/189 |
| 3,740,273 A | 6/1973 | Adler et al. | 136/202 |
| 5,228,923 A | 7/1993 | Hed | 136/208 |

FOREIGN PATENT DOCUMENTS

| DE | 4134685 | 4/1993 |
| EP | 592044 | 4/1994 |
| FR | 2620573 | 3/1989 |
| WO | 9904439 | 1/1999 |

Primary Examiner—Nam Nguyen
Assistant Examiner—Thomas H Parsons
(74) Attorney, Agent, or Firm—Wenderoth, Lind & Ponack, L.L.P.

(57) ABSTRACT

The solid state thermoelectric device includes at least an array of metallic conductor and/or N-type and P-type semiconductor thermoelectric elements assembled on a printed circuit and forming thermoelectric couples electrically connected in series. The structure of the device is formed of at least a pair of laminated elements each formed of a supporting layer made of polymeric material and at least a layer of conductive material, a layer of joining material interposed between the two laminated elements of polymeric material for firmly connecting them one to the other. The printed circuit is made from the layer of conductive material of the laminated elements and electrically connects in series the thermoelectric elements to form thermoelectric couples having the hot or cold sides, respectively, on only one side of the structure. The structure of the thermoelectric device has a spirally or circularly wound configuration.

17 Claims, 12 Drawing Sheets

SOLID STATE THERMOELECTRIC DEVICE

TECHNICAL FIELD

The present invention generally relates to thermoelectric devices, and particularly to a thermoelectric device for use in a solid state thermoelectric heat pump.

The thermoelectric effect is a phenomenon that occurs when a difference in temperature exists in an electric circuit. An example of thermoelectric effect is given by the Peltier effect. In simple terms, if an electric current is passed through a metal-metal or metal-semiconductor junction, heat is liberated or absorbed at the junction depending on the direction of the electric current. The Peltier effect is reversible, i.e. if the direction of the electric current is reversed, the cold junction becomes hot and the hot junction becomes cold. It has been found that greater temperature differences are achievable by using metal-semiconductor junctions rather than metal-metal junctions. The Peltier effect is the principle of operation of solid state thermoelectric heat pumps.

In the following, the term "thermoelectric device" designates a solid state device that makes use of the Peltier effect for heating or cooling a material substance. The term "thermoelectric element" designates a metallic conductor or a semiconductor material bar. The term "thermoelectric couple" designates a combination of two thermoelectric elements that are electrically connected in series at one end thereof through an electrode.

BACKGROUND ART

Solid state thermoelectric heat pumps are commercially available since 1960. Initially, the heat pumps included metallic conductor thermoelectric elements. At present time, the modern technology in the field of semiconductors provides solid state thermoelectric heat pumps with thermoelectric elements formed from alloys of $Bi_2Te_3$, PbTe, SiGe, BiSb N-type and P-type doped. The thermoelectric devices that are generally known in the art have a planar configuration showing varying geometrical forms. In this kind of thermoelectric devices the thermoelectric couples are supported in a sandwich structure by means of elements made of an $Al_2O_3$ based ceramic material which is laminated together with copper.

DISCLOSURE OF THE INVENTION

The present invention provides a thermoelectric device with a novel arrangement of thermoelectric couples formed of metallic conductor and/or N-type and P-type semiconductor thermoelectric elements. The present invention also provides a heat pump comprising the thermoelectric device of the invention.

According to a first embodiment of the present invention, the solid state thermoelectric device includes at least an array of metallic conductor and/or N-type and P-type semiconductor thermoelectric elements assembled on a printed circuit, whereby said thermoelectric elements form thermoelectric couples electrically connected in series, and is characterised in that it has a structure formed of:

at least a pair of laminated elements, each formed of a supporting layer made of polymeric material and at least a layer of conductive material, a layer of joining material interposed between said two laminated elements of polymeric material for firmly connecting them one to the other, and in that, the printed circuit is made from the layer of conductive material of the laminated elements and electrically connects in series the thermoelectric elements to form thermoelectric couples having the hot or cold sides, respectively, on only one side of the structure, and said structure of the thermoelectric device has a spirally or circularly wound configuration.

According to a second embodiment of the present invention, the solid state thermoelectric device includes at least an array of metallic conductor and/or N-type and P-type semiconductor thermoelectric elements assembled on a printed circuit, whereby said thermoelectric elements form thermoelectric couples electrically connected in series, and is characterised in that it has a structure formed of:

a laminated element formed of a supporting layer made of polymeric material and on each face thereof a layer of conductive material, a layer of joining material interposed between the end portions of the laminated elements in order to firmly connect them one to the other, and in that the printed circuit is made from at least one of the layers of conductive material of the laminated element and electrically connects in series the thermoelectric elements to form thermoelectric couples having the hot or cold sides, respectively, on only one side of the structure, and said structure has a spirally or circularly wound configuration.

BRIEF DESCRIPTION OF DRAWINGS

The present invention will now be described more in detail in connection with the accompanying drawings, wherein.

BEST MODE FOR CARRYING OUT THE INVENTION

Figure 1:
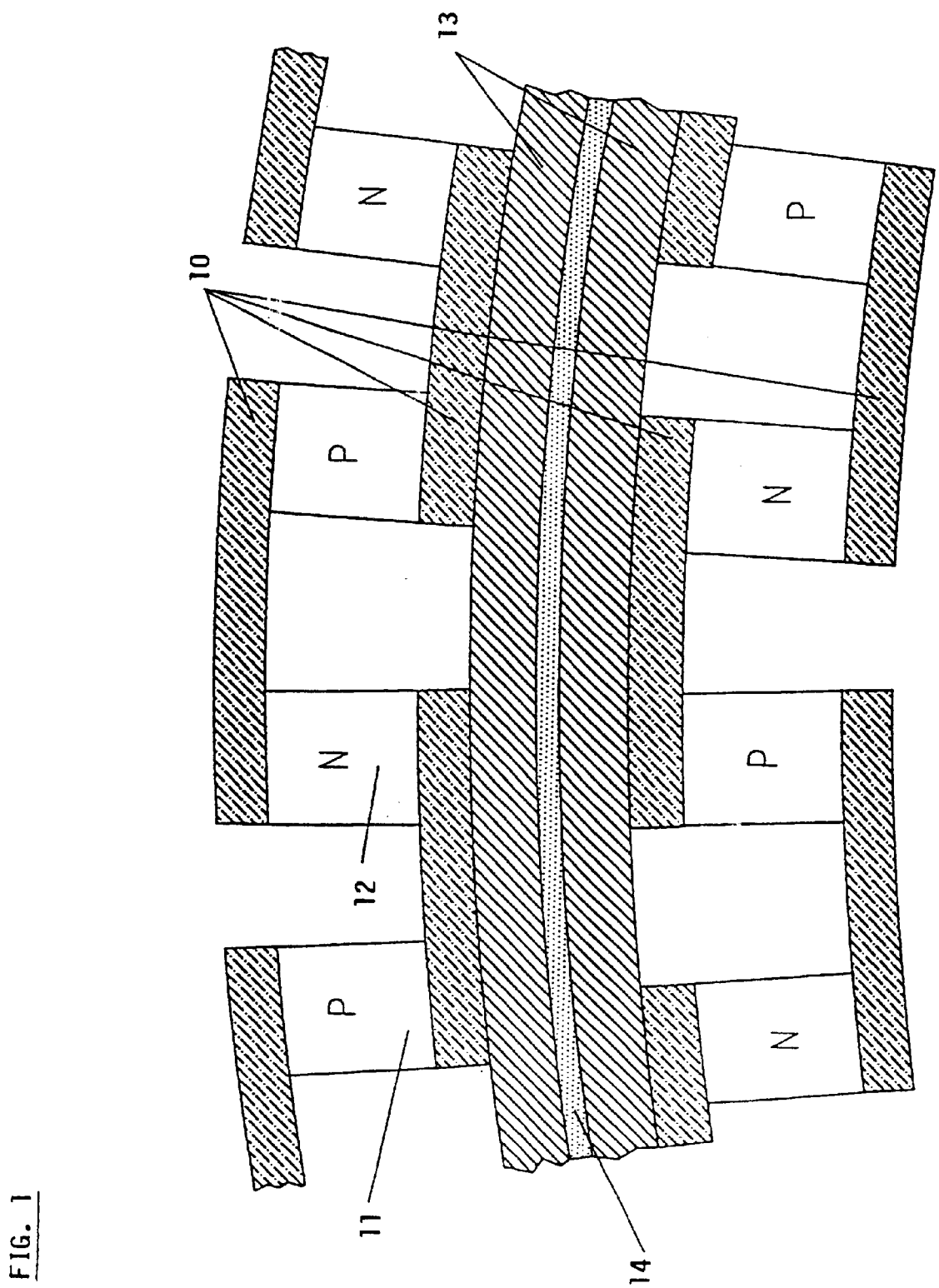
FIG. 1 is a partial cross sectional view of the thermoelectric device according to a first embodiment of the present invention.

Referring to FIG. 1 of the drawings, there is shown a first embodiment of the thermoelectric device of the invention. According to this first embodiment, the thermoelectric device comprises a pair of laminated elements, each of which is formed of a layer of polymeric material and a layer of metallic material, typically a copper material. The two laminated elements are mutually and directly joined together through their layers of polymeric material by interposing therebetween an adhesive resin with a high heat transmission coefficient, f.i. an epoxy resin containing a silver or metal oxide filler. The so attached laminated elements are coiled in a spiral or circular configuration to form the core of the thermoelectric device to be applied to a solid state thermoelectric heat pump. The pattern of the printed circuit to which the thermoelectric elements are connected is made on the metallic material layer by an etching process. Each coil of the spiral or circular wound core is therefore formed of a pair of laminated elements joined together with an adhesive. Numeral 10 designates the cross section of the tracks of metallic material onto which the P-type and N-type thermoelectric elements 11 and 12, respectively, are soldered by using a eutectic tin alloy. Numeral 13 designates the cross section of the layer of polymeric material and numeral 14 designates the layer of adhesive material joining together the two laminated elements of the spiral or circular wound core in order to give it compactness and dimensional stability. The thickness of the tracks of metallic material 10 will vary depending on the power and, therefore, the peak value of the electric current flowing in the thermoelectric device of the invention. Of course, the thickness of the tracks should not be undersized in order to avoid overheating of the tracks caused by Joule effect. Preferably, the measure of thickness should range from 70 to 300 $\mu$m. The thickness of the layer of polymeric material 13 depends on the mechanical force used in winding and packing the core of the thermoelectric device. Practically, the measure of this thickness will be chosen in order to assure on one hand a good mechanical strength and on the other hand an effective heat transmission. Preferably, the measure of thickness should range from 50 to 150 $\mu$m. The purpose of the layer of adhesive material 14 is to pack the core and even the contacting surfaces of the two laminated elements, in order to prevent formation of air bubbles and to level off possible surface imperfections. Another purpose of the layer of adhesive material 14 is to assure a good heat transmission. To this purpose, a thermosetting resin, e.g. an epoxy resin containing a finely ground metallic element filler should be used. The resin is spread with a scraper in order to limit the quantity of material deposed and to form a thin layer, preferably with a thickness not greater than 10 to 15 $\mu$m. The resin should be formulated so that it will simultaneously and completely set during the soldering operation of the thermoelectric elements which is carried out at a temperature of almost 140 degrees Celsius in the case N-type and P-type semiconductor thermoelectric elements are used.

Figure 2:
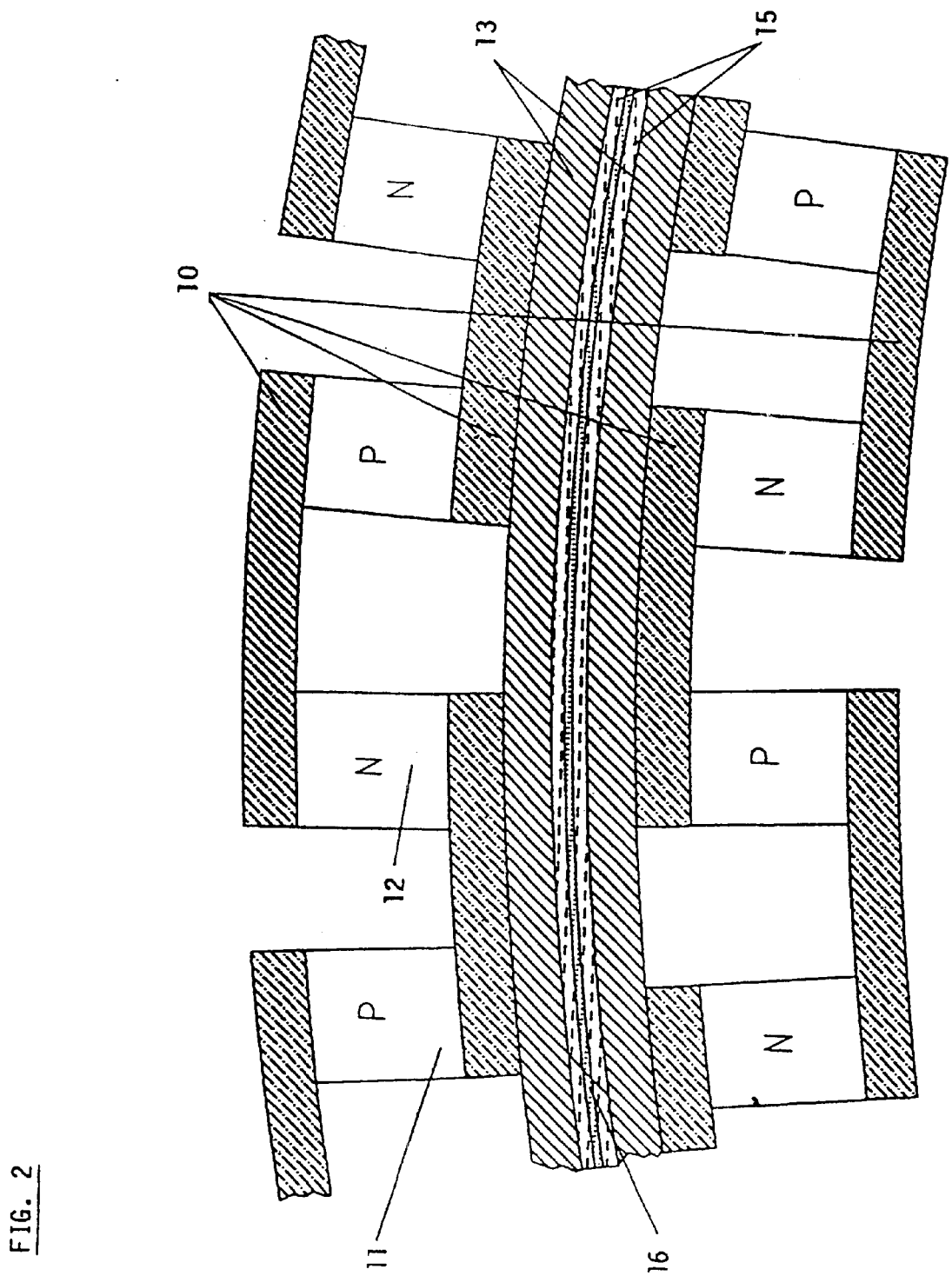
FIG. 2 is a partial cross sectional view of the thermoelectric device according to a second embodiment of the present invention.

Referring now to FIG. 2 of the drawings, there is shown a second embodiment of the thermoelectric device of the invention. According to this embodiment, the thermoelectric device comprises a pair of laminated elements, each of which is formed of a layer of polymeric material and two layers of metallic material, typically a copper material, arranged on the two opposite surfaces of the layer of polymeric material. The two laminated elements are mutually and directly joined together through their thinner layers of metallic material by means of a soldering operation. A layer of Sn—In eutectic alloy which melts at 118 degrees Celsius or a layer of Sn—Bi eutectic alloy which melts at 135 degrees Celsius should be used depending on whether the wound core is formed of spiral or circular coils. The pattern of the printed circuit supporting the thermoelectric elements is made on the thicker layer of metallic material of each laminated elements. The two laminated elements are simultaneously soldered together with the semiconductors in the case of a spiral form wound core assembly and sequentially in the case of a circular form wound core assembly. In both cases, the final result is a wound core to be applied to a solid state heat pump. Numeral 10 designates the cross sections of the tracks of metallic material onto which the P-type and N-type thermoelectric elements 11 and 12, respectively, are soldered with a eutectic tin alloy. Numeral 13 designates the cross section of the layer of polymeric material and numeral 15 designates the thinner layer of metallic material. Numeral 16 designates the cross-section of the Sn—In or Sn—Bi eutectic alloy layer which joins together the two laminated elements of the spiral or circular wound core in order to impart it compactness and dimensional stability. The thickness of the track 10 of metallic material will vary depending on the power and, therefore, the peak value of the electric current flowing in the thermoelectric device of the invention. Of course, the thickness of the tracks should not be undersized in order to avoid overheating of the tracks caused by Joule effect. Preferably, the measure of this thickness should range from 70 to 300 $\mu$m. The thickness of the layer of polymeric material 13 depends on the mechanical force used in winding and packing the core of the thermoelectric device. Practically, the measure of thickness should be chosen in order to assure on one hand a good mechanical strength and on the other hand an effective heat transmission. In this second embodiment of the invention, the thinner layer of metallic material 15 does not undergo an etching operation because its purpose is to contribute to the mechanical strength. Therefore, the measure of thickness to be considered should preferably range from 35 to 100 $\mu$m. The purpose of the thin layer of metallic material 15 is to support the eutectic alloy used for the final soldering of the two laminated elements of the spiral or circular wound core. Preferably, the thickness of the thin layer of metallic material 15 should range from 15 to 30 $\mu$m. The layer of eutectic alloy 16 is deposed in advance onto at least one of the two laminated elements, e.g. by means of a tin flow deposition operation or a spreading operation using a mask to spread a compound of a thixotropic dispersion of the eutectic tin alloy formulated with an appropriate flux. The choice of a thermoelectric device made according to the first or second embodiment of the present invention depends on the design specifications and the manufacturing costs.

Figure 3:
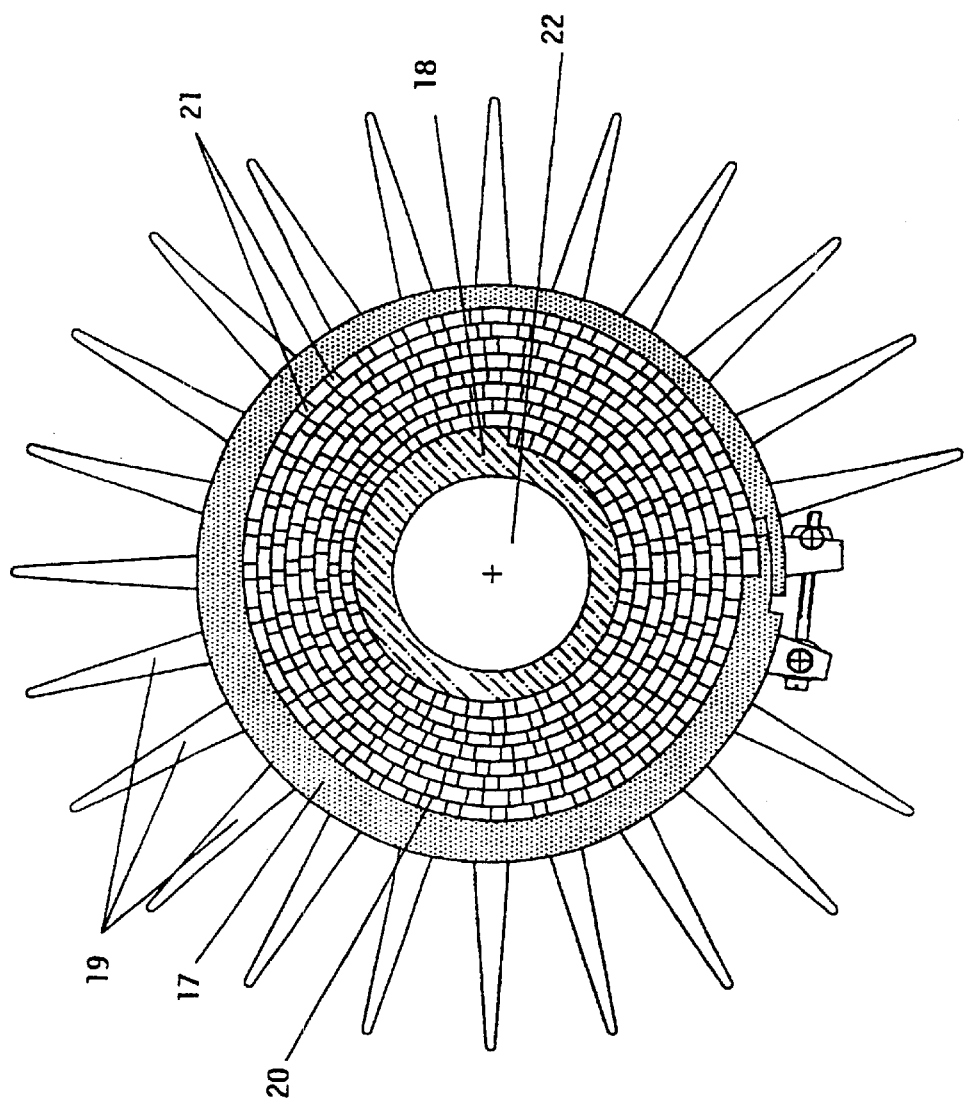
FIGS. 3 and 4 are a cross sectional view of the thermoelectric device according to either the first or the second embodiment of the present invention applied to a solid state heat pump.
Figure 4:
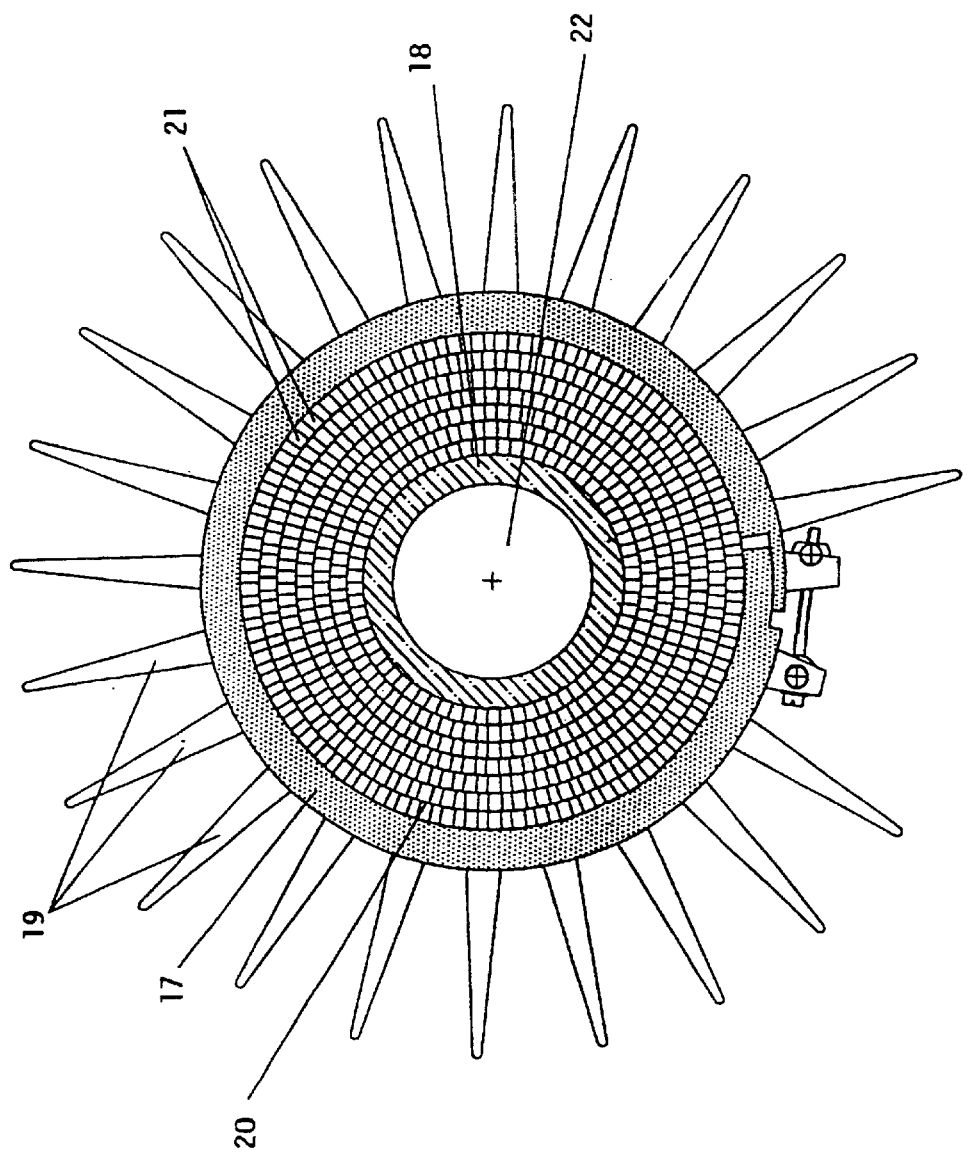

Referring to FIGS. 3 and 4 of the drawings, there is shown a crosssection of the thermoelectric device according to either the first or second embodiment of the invention. The thermoelectric device is applied to a solid state heat pump. The dimension of the heat pump may vary depending on the rated power thereof. Numerals 17 and 18 designate an external and internal tube, respectively, of the heat exchanger used in the solid state thermoelectric heat pump. Numeral 19 designates the cooling fins of the external heat exchanger tube. The external exchanger tube 17 is arranged around the spiral or circular wound core 20 of FIGS. 3 and 4. The configuration of the cooling fins depends on the quantity of heat that should be dissipated, taking into account the fact that the heat exchanger tubes must not operate at a temperature greater than 50 to 55 degrees Celsius in order to assure a good operation of the heat pump. Alternatively, the heat exchanger tube 17 can be designed with smaller cooling fins and internally provided with a hollow space through which a cooling fluid is circulated. The heat exchanger tube 17 can be entirely made of aluminium and its thickness should be capable of imparting some flexibility to the structure in order to secure tightening of the surfaces in direct thermal contact. Further, in the case of the spiral wound core illustrated in FIG. 3, the contour of the external heat exchanger tube 17 should take into account the eccentricity due to the structure that forms the spiral wound core. As can be understood, in the thermoelectric device according to the first and second embodiment of the invention the core has a structure formed of all the thermoelectric couples supported by the layer of polymeric material of the laminated elements. The coils forming the wound core are closely packed and joined together by means of a heat conductive adhesive, in the case of the laminated elements of FIG. 1, or by means of a Sn—In or Sn—Bi eutectic alloy, in the case of the laminated elements of FIG. 2. The number of coils forming the wound core depends on the rated power of the thermoelectric heat pump. Experimental results show that optimal performance is obtained with a number of coils ranging from 1 to 15 without excessive manufacturing costs. Numeral 21 illustrates the location of two metallic conductor or Ntype and P-type semiconductor thermoelectric elements soldered onto the structure of the spiral or circular wound core. The heat exchanger tube 18 can be entirely made of copper and, in the case of the spiral wound core of FIG. 3, it is contoured so as to provide in the portion where the laminated elements is directly supported, a groove which compensates for the eccentricity caused by the structure forming the spiral wound core. In so doing, any area of missing contact between the laminated elements and the metallic surface of the internal exchanger tube 18 is avoided. Finally, numeral 22 designates the internal hollow portion of the internal heat exchanger tube 18 through which the working fluid flows.

Figure 5:
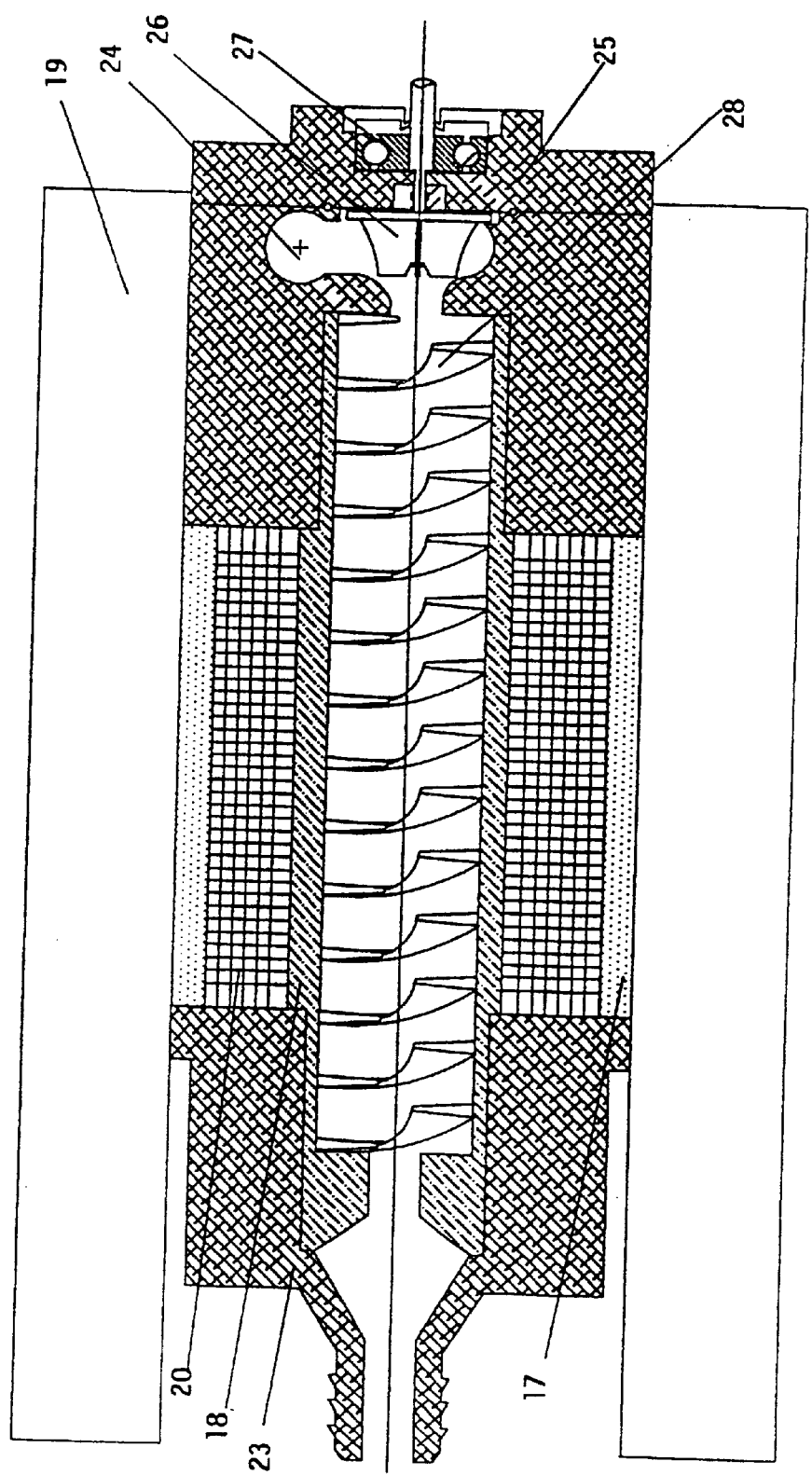
FIG. 5 is a longitudinal sectional view of the thermoelectric device according to either the first or the second embodiment of the present invention applied to a solid state heat pump.
Figure 6:
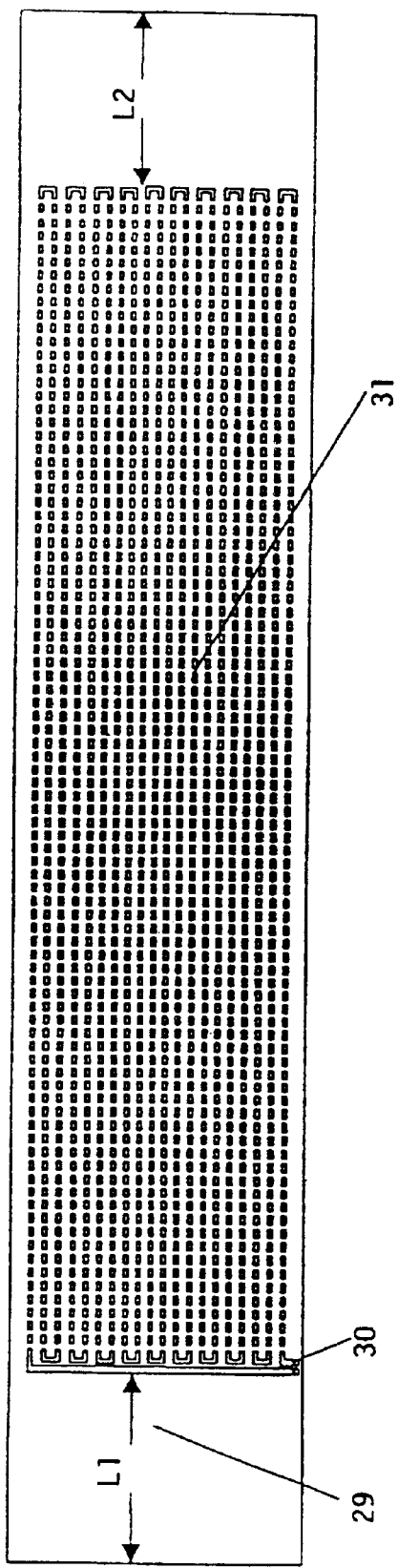
FIG. 6 is a top plan view of a first pattern of the printed circuit used to form the thermoelectric couples of the thermoelectric device according to either the first or the second embodiment of the present invention.

Referring to FIG. 5 of the drawings, there is shown a longitudinal section of the heat pump of FIG. 3. Numeral 20 designates the location of the spiral or circular wound core inside the heat pump. The coils are closely packed and the external and internal heat exchanger tubes 17,18 are assembled so as to avoid the formation of air bubbles between the contacting surfaces. The internal heat exchanger tube 18 is contoured so as to take into account the eccentricity due to the structure forming the spiral wound core. On the contrary, the end portions of the internal heat exchanger tube 18 are substantially circular in cross section. Of course, the dimensions of the internal heat exchanger tube 18 depend on the intended heat exchange capacity. The heat pump is provided with two end covers 23,25 which close the heat pump assembly. The front cover 23 is made of a thermoinsulating polymeric material, e.g. polytetrafluoro ethylene, polyvinylidene fluoride, polyamide-6,6, high density polyethylene, so as to thermally insulate the respective side of the heat pump and avoid the formation of condensate. The choice of the material depends on design specifications. The external heat exchanger tube 17 that surrounds and encloses the wound core 20 is circular in cross section in the case of a circular wound core, whereas it is internally contoured so as to take into account the eccentricity of the structure forming the wound core in the case of a spiral wound core. The external heat exchanger tube 17 should have a thickness assuring a suitable flexibility when it is tightened and locked around the wound core. Numeral 19 designates the cooling fins which are integral with the external heat exchanger tube 17. The overall radiant surface of the fins depends on the rated power and whether or not a forced air cooling system is provided. Alternatively, the heat exchanger tube 17 can be designed with smaller cooling fins and internally provided with a hollow space through which a cooling fluid is circulated. Numeral 24 designates the volute stator of the working fluid circulation pump provided inside the rear cover 25 of the heat pump. The flow rate of the circulation pump depends on the overall extent of heat exchange circuit and the intended heat exchange rate. The example illustrated in the FIG. 5 relates to heating or cooling systems wherein a single heat pump is provided in the heat exchange circuit. However, modular heating or cooling systems comprising two or more heat pumps connected in series can also be made and a single circulation pump is provided externally to the heat pumps. Numeral 26 designates the impeller of the circulation pump. The impeller is keyed to a shaft 27 of an electric motor (not shown). A cooling fan for generating a forced air flow to be passed through the cooling fins 19 of the external heat exchanger tube 17 can also be keyed to the shaft 27. The rear cover 25 is made of a thermoinsulating polymeric material, e.g. polytetrafluoro ethylene, polyvinylidene fluoride, polyamide-6,6, high density polyethylene, for the purpose of insulating the respective end portion of the heat pump and avoid condensate. The choice of the material depends on design specifications. In the case of modular heating or cooling systems wherein two or more heat pumps are connected in series, the two covers can be exactly identical and symmetrical to each other. In this case, the circulation of the working fluid through the heat pump will be assured by an external circulation pump. Finally, numeral 28 designates a metallic spiral inserted in the internal heat exchanger tube 18. The purpose of the metallic spiral 28 is to extend the time the working fluid stays inside the heat pump and to generate a turbulent flow which enhances the heat exchange. The metallic spiral 28 can be made of stainless steel and is inserted with interference fit inside the internal heat exchanger tube 18 during the final assembly operation of the heat pump. With reference to FIG. 6 of the drawings, there is shown a first pattern of the printed circuit of the laminated elements of the thermoelectric device of the invention onto which the thermoelectric elements are supported. The length and width of the laminated element with the printed circuit and the lengths L1,L2 of the end portions thereof depend on the rated power of the heat pump and, therefore, they are defined by design specifications. For a rated power less than or equal to 500 W there can be provided configurations whereby a single array of thermoelectric elements are connected in series. For a greater rated power, the tracks of the printed circuit should have a greater thickness. Numeral 29 designates an end portion of the laminated element the purpose of which is to fasten it to the internal heat exchanger tube 18 of the heat pump. Numeral 30 designates the connection terminals of the printed circuit to which an external power source is connected. Numeral 31 designates the printed circuit onto which the thermoelectric elements are soldered. In the case of the spiral wound core of FIG. 3, the distance between each track of the printed circuit must take into account the distance between the thermoelectric elements inside the structure when a variable curvature is given to this during the winding operation.

Figure 7:
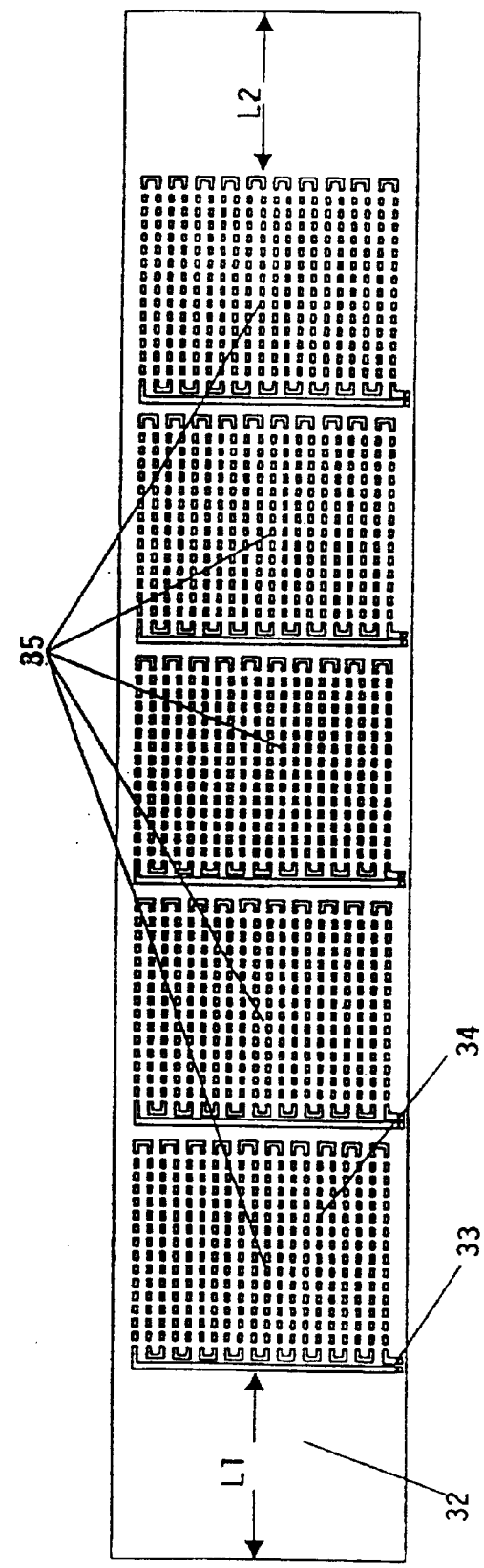
FIG. 7 is a top plan view of a second pattern of the printed circuit used to form the thermoelectric couples of the thermoelectric device according to either the first or the second embodiment of the present invention.

Referring to FIG. 7 of the drawings, there is shown a second pattern of the printed circuit of the laminated elements of the thermoelectric device of the invention onto which the thermoelectric elements are supported. Also in this case, the length and width of the laminated element with the printed circuit and the lengths L1,L2 of the end portions thereof depend on the rated power of the heat pump and, therefore, they are defined by design specifications. For a rated power greater than 500 W it is convenient to provide a configuration formed of two or more electrically separated arrays of thermoelectric elements connected in series Such a configuration permits the thickness of the laminated element to be optimised. In the case a greater power is required, the tracks of the printed circuit should have a greater thickness. Numeral 32 designates an end portion of the laminated element the purpose of which is to fasten it to the internal heat exchanger tube 18 of the heat pump. Numeral 33 designates the connection terminals of the printed circuit to which an external power source is connected. Numeral 34 designates the printed circuits onto which the thermoelectric elements of each member of the array of thermoelectric elements are soldered. In the case of the spiral wound core shown in FIG. 3, the distance between the tracks of metallic material should take into account the distance between the thermoelectric elements inside the structure when a variable curvature is given to it during the winding operation. Numeral 35 designates the group of electrically separated arrays of thermoelectric elements. This configuration permits the total electric power of the heat pump to be modulated and avoids performance deterioration of the heat pump caused by Joule effect.

Figure 8:
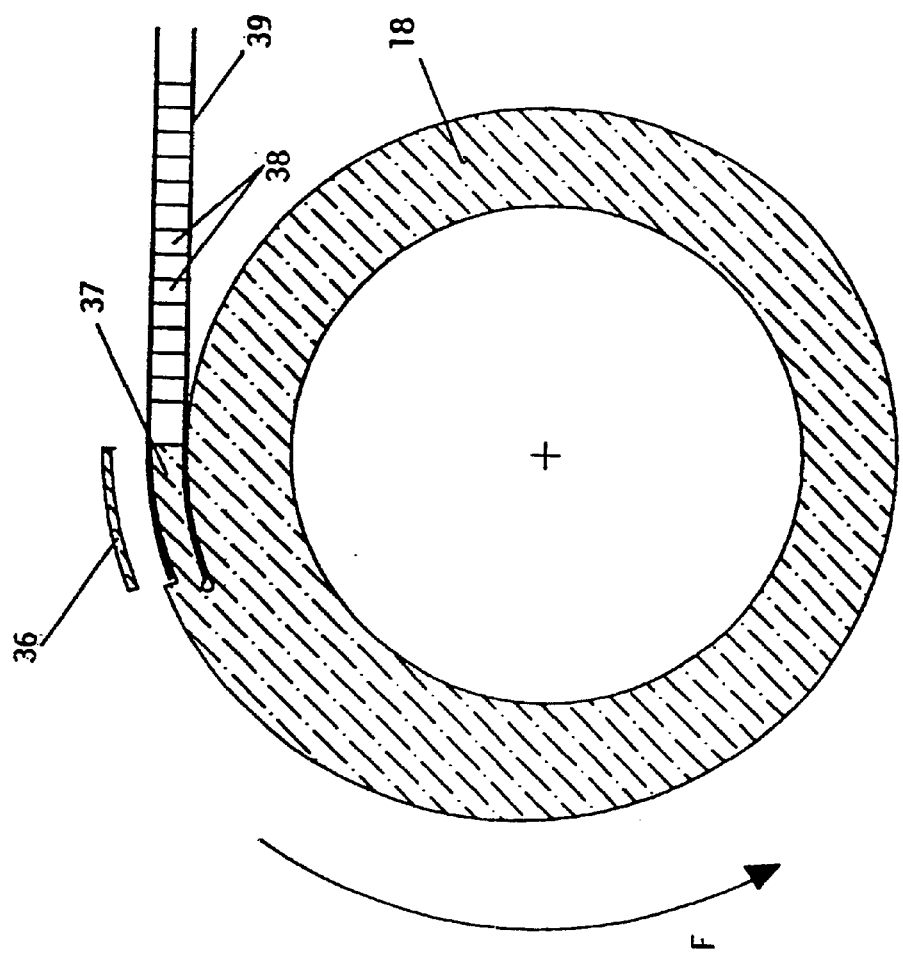
FIG. 8 is a cross sectional view of the fastening means for connecting the thermoelectric device according to either the first or the second embodiment of the invention to the internal heat exchanger tube of a solid state heat pump.

Referring to FIG. 8 of the drawings, there is shown a central cross section of the internal heat exchanger tube 18. In particular, there is illustrated the fastening system whereby the structure of a spiral wound core of the thermoelectric device of the invention is connected to the internal heat exchanger tube of the heat pump. The fastening system avoids the surfaces of the laminated elements which support the tracks of metallic material onto which the thermoelectric elements are soldered to be displaced during the winding operation. The displacement of the laminated elements could cause an interruption of the electrical contact. Numeral 36 designates a plate for uniformly fastening the end portion of the structure. The plate 36 is attached to the body of the internal heat exchanger tube 18 by means of screws not shown in FIG. 8. Numeral 37 designates a slot provided in the radial compensation step of the internal heat exchanger tube 18. The purpose of this slot is to uniformly fasten the end portion of the structure and to exert a fastening force when the above mentioned screws are screwed. Numeral 38 illustrates the location of the N-type and P-type thermoelectric elements inside the structure and numeral 39 designates the cross section of the supporting laminated elements. There is also shown a cross section of the internal heat exchanger tube 18. The arrow F on the left of the cross section indicates the direction of rotation of the internal heat exchanger tube 18 during, the winding operation of the structure.

Figure 9:
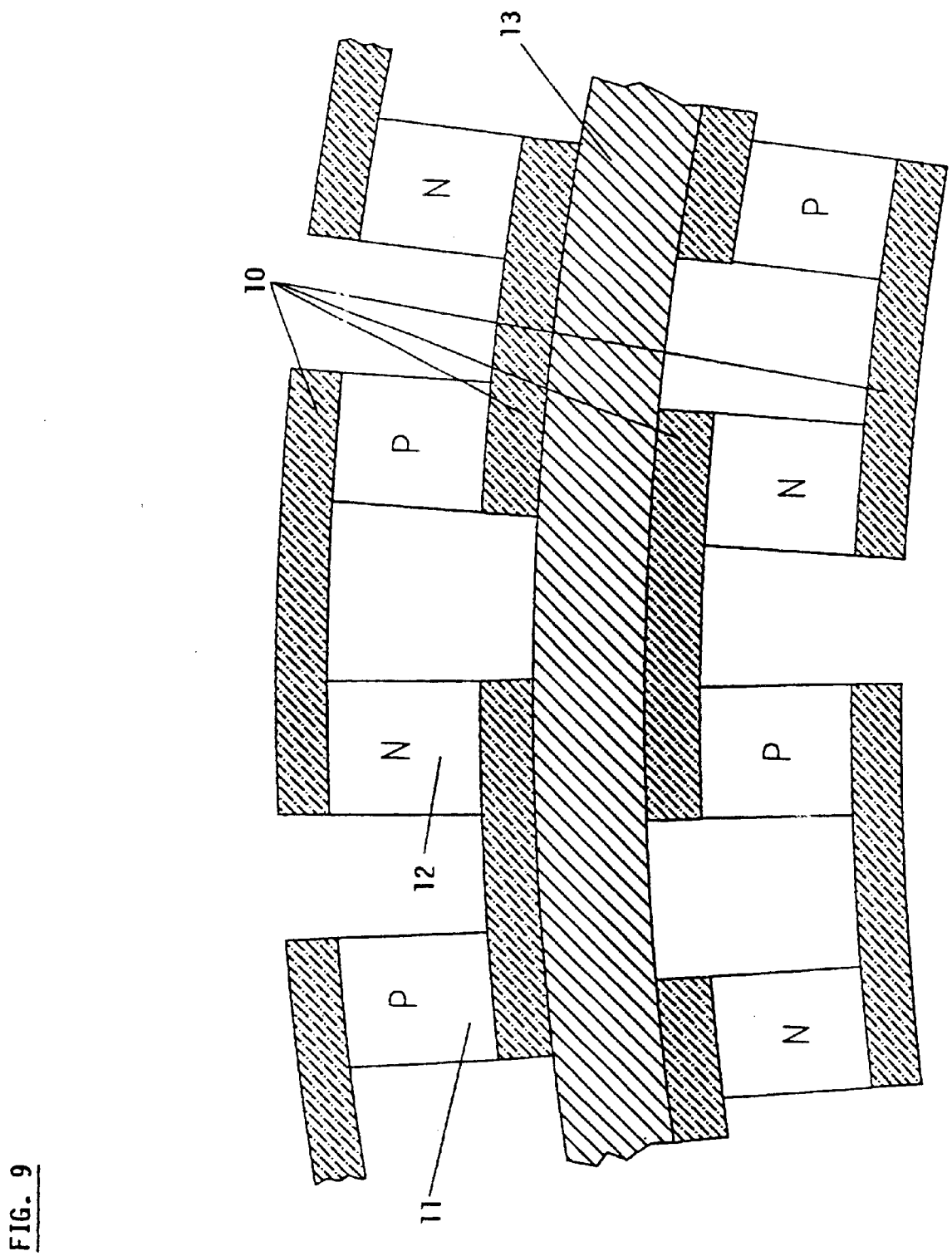
FIG. 9 is a partial cross sectional view of the thermoelectric device according to a third embodiment of the present invention.

Referring to FIG. 9 of the drawings, there is shown a third embodiment of the thermoelectric device of the invention. According to this third embodiment, the thermoelectric device comprises a single laminated element formed of a layer of polymeric material and a pair of layers of metallic material, typically a copper material, each covering one of the opposite faces of the layer of polymeric material. The end portions of the laminated element in the wound configuration are connected together by means of an adhesive resin with a high heat transmission coefficient, f.i. an epoxy resin containing a silver or metal oxide filler. The laminated element is coiled in a spiral or circular configuration to form the core of the thermoelectric device applied to a solid state thermoelectric heat pump. The pattern of the printed circuit to which the thermoelectric elements are connected is made on both layers of metallic material by way of an etching process. Each coil of the spiral or circular wound core is therefore formed of a single laminated element the ends of which are joined together with an adhesive. Numeral 10 designates the cross section of the tracks of metallic material onto which the P-type and N-type thermoelectric elements 11 and 12, respectively, are soldered by using a eutectic tin alloy. Numeral 13 designates the cross section of the layer of polymeric material. The thickness of the tracks of metallic material 10 will vary depending on the power and, therefore, the peak value of the electric current flowing in the thermoelectric device of the invention. Of course, the thickness of the tracks should not be undersized in order to avoid overheating of the tracks caused by Joule effect. Preferably, the measure of thickness should range from 70 to 300 $\mu$m. The thickness of the layer of polymeric material 13 depends on the mechanical force used in winding and packing the core of the thermoelectric device. Practically, the measure of thickness will be chosen in order to assure on one hand a good mechanical strength and on the other hand an effective heat transmission. Preferably, the measure of thickness should range from 35 to 150 $\mu$m.

Figure 10:
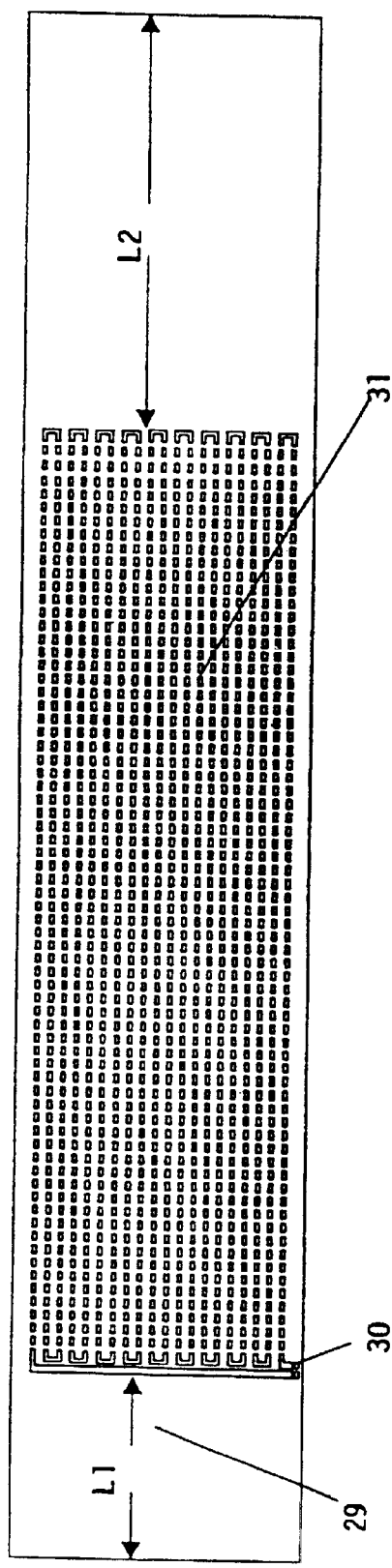
FIG. 10 is a top plan view of the pattern of the printed circuit used to form the thermoelectric couples of the thermoelectric device according to the third embodiment of the present invention.
Figure 11:
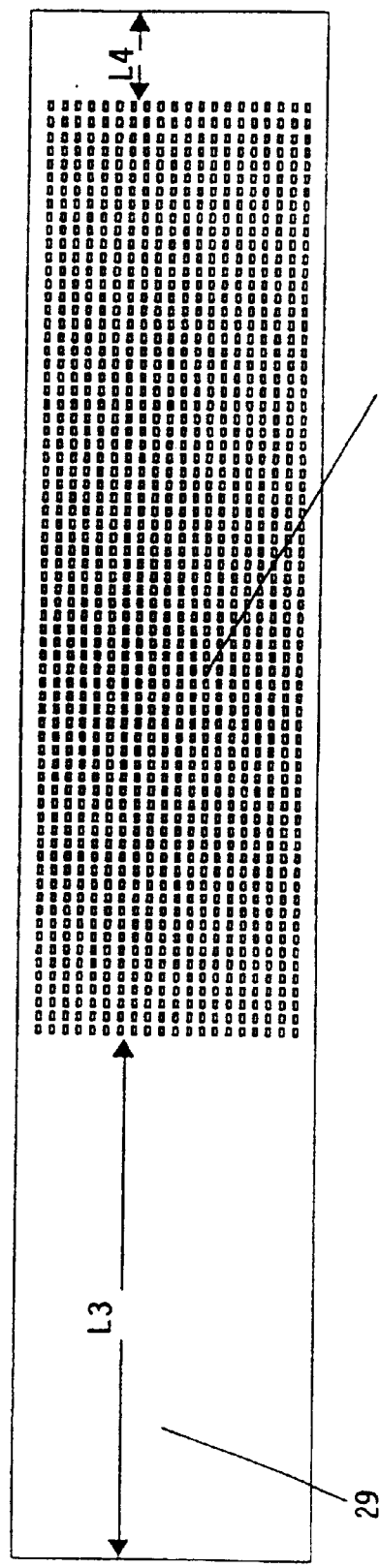
FIG. 11 is a bottom plan view of the pattern of the printed circuit used to form the thermoelectric couples of the thermoelectric device according to the third embodiment of the present invention.

Referring to FIGS. 10 and 11 of the drawings, there is shown the arrangement of the tracks of metallic material provided on both of the opposite faces of the layer of polymeric material. These tracks form the printed circuit onto which the thermoelectric elements are soldered. The pattern of the printed circuit to which the thermoelectric elements are connected is made on the metallic material layer by way of an etching process. The length and width of the laminated element with the printed circuit and the lengths L1,L2 on one side and L3,L4 on the other side of the end portions thereof depend on the rated power of the heat pump and, therefore, they are defined by design specifications. The free ends of the laminated element are joined together by means of an adhesive layer formed of a heat conductive epoxy resin containing finely ground metallic elements. The resin is spread with a scraper in order to limit the quantity of material deposed and to form a thin layer, preferably with a thickness not greater than 10 to 15 $\mu$m.

Figure 12:
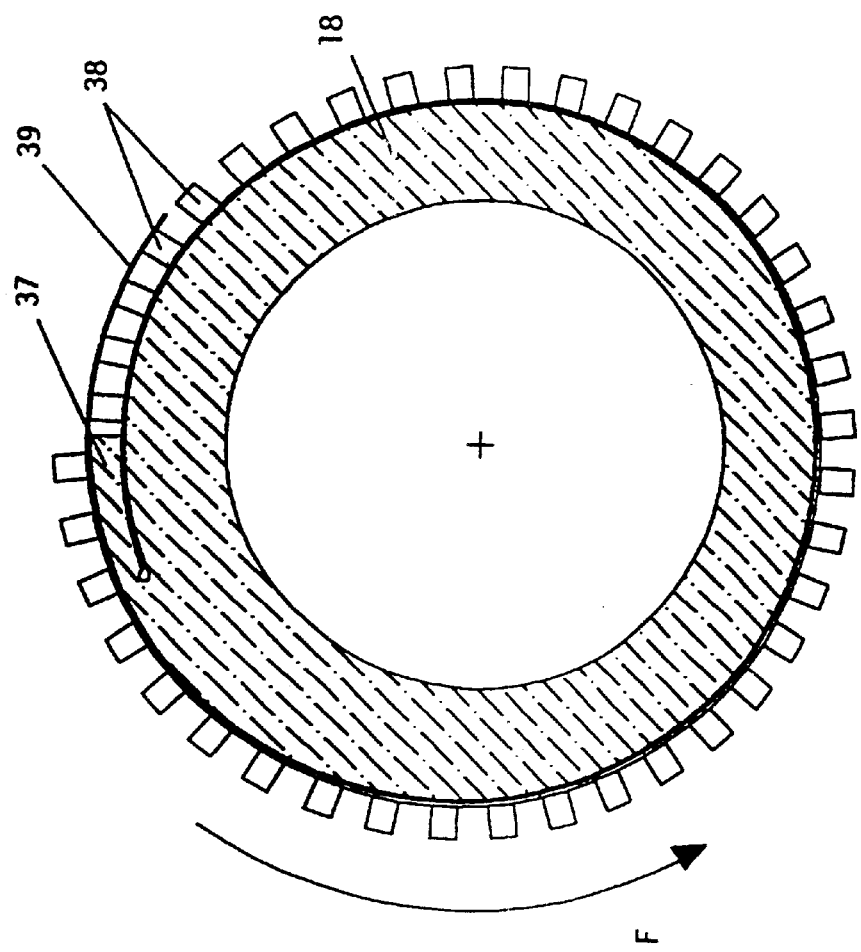
FIG. 12 is a is a cross sectional view of the fastening means for connecting the thermoelectric device according to the third embodiment of the present invention to the internal heat exchanger tube of a solid state heat pump.

Referring to FIG. 12 of the drawings, there is shown a central cross section of the internal heat exchanger tube 18.

In particular, there is illustrated the fastening system whereby the structure of the thermoelectric device of the invention is connected to the internal heat exchanger tube of the heat pump. This fastening system avoids the surfaces of the laminated elements that support the tracks of metallic material onto which the thermoelectric elements are soldered to be displaced during the winding operation. The displacement of the laminated elements could cause an interruption of the electrical contact, Numeral 37 designates the slot provided in the radial compensation step on the internal heat exchanger tube 18. The purpose of this slot is to uniformly fasten the end portion of the structure and to exert a fastening force when the above mentioned screws are screwed. Numeral 38 illustrates the location of the N-type and P-type thermoelectric elements inside the structure and numeral 39 designates the cross section of the supporting laminated element. There is also shown a cross section of the internal heat exchanger tube 18. The arrow F on the left of the cross section indicates the direction of rotation of the internal heat exchanger tube 18 during the winding operation of the structure. Preferably, the polymer material of the supporting layer is a film made of polyimide, polybutilene terephtalate, polyethylene naphtalate, polycarbonate, polyamide 6, copolyamide 6-X, wherein X=6 , . . . 12, polyaryle amide MXD6, polyphenylene, polyfenylene sulphide, polycarbonate-polybutylene terepthalate copolymer, polycarbonate-polyethylene napthalate copolymer, polycarbonate-polyaryle amide copolymer, polybuthylene terepthalate-polyamide or copolyamide copolymer, polyketone.

Figure 13:
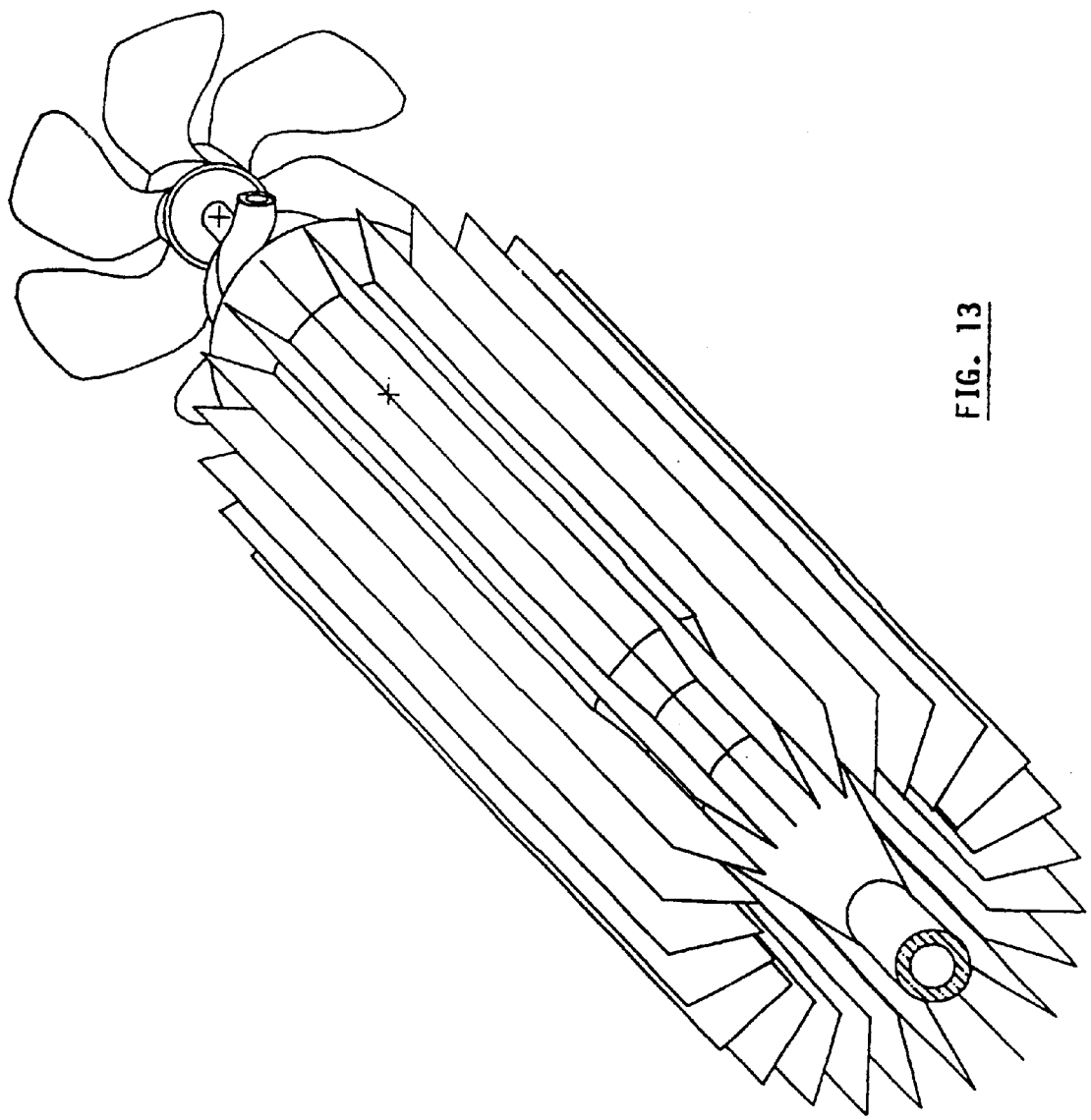
FIGS. 13 and 14 are perspective views of a heat pump provided with any one embodiment of the thermoelectric devices of the present invention.
Figure 14:
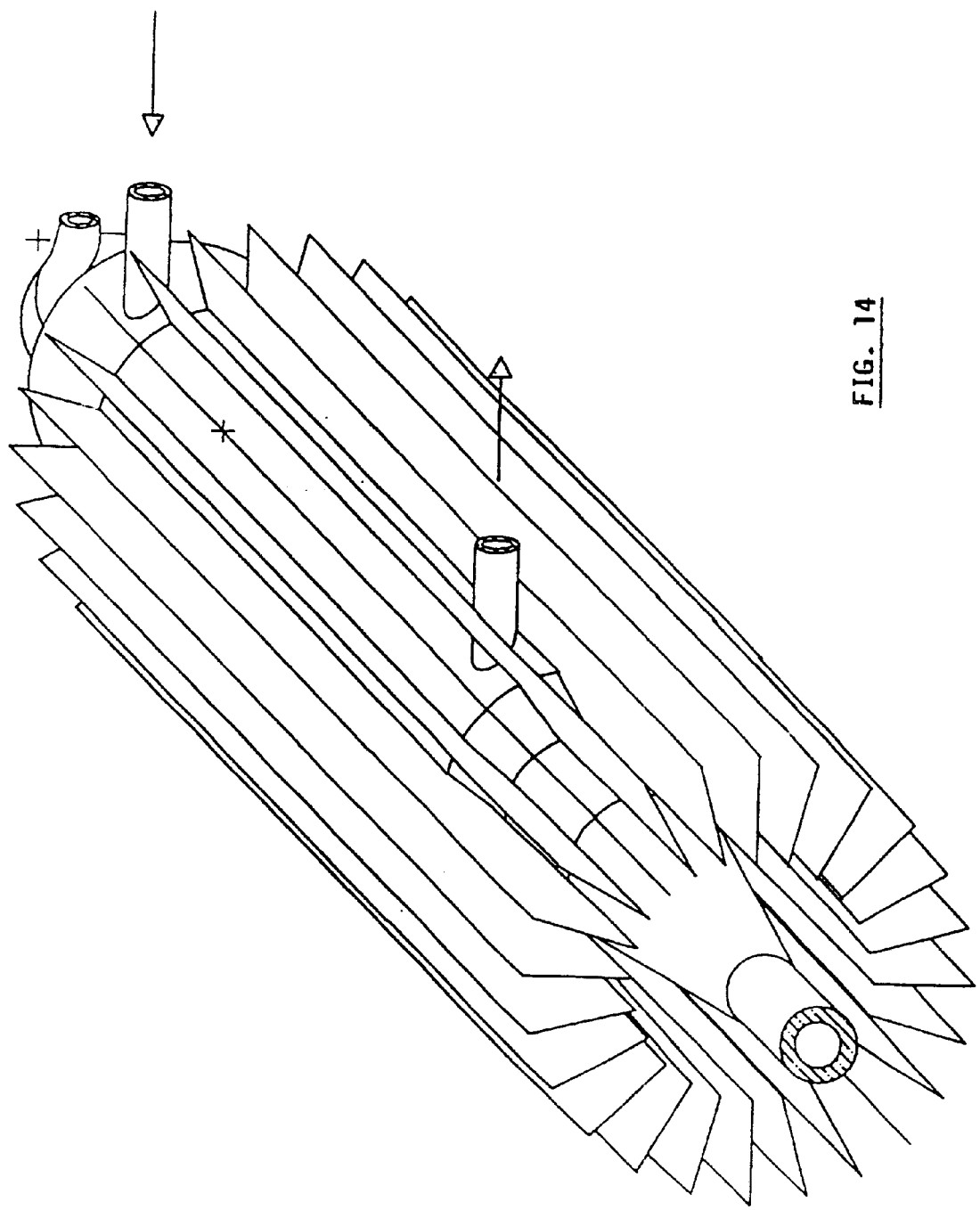

FIG. 13 is a perspective view of the heat pump illustrated in cross section in FIGS. 3, 4 and 5 and provided with a forced air cooling of the external heat exchanger tube. FIG. 14 is a perspective view of the heat pump illustrated in cross section in FIGS. 3,4 and 5 and provided with liquid cooling of the external heat exchanger tube.

From the foregoing it is understood that the spiral or circular wound core permits coils having dimensions increasing with the diameter to be obtained, wherein the hot/cold surface (depending on the direction of the current) of each coil exchanges heat with the cold/hot surface of the immediately adjacent coil. In this manner, with respect to a geometrically planar configuration as known in the art, the resulting efficiency of the system is increased because the total resistance of the wound core is reduced.

The invention permits solid state thermoelectric heat pumps of medium power and high efficiency to be made. These heat pumps are usable in the refrigeration field for making environmentally friendly refrigerating systems without the use of harmful gases. Other possible uses of the heat pump of the invention are in the field of industrial, nautical, aeronautical, instrument, automotive and building cooling and heating systems.

The apparatus is supplied by a D.C. power source with a voltage that depends on the defined design specifications; if the heat pump is installed in an area wherein a D.C. power source is not directly available, but only an A.C. power source is available, an A.C.—D.C. power converter will be provided with a ripple not greater than 10%.

What is claimed is:

1. Solid state thermoelectric device including at least one array of metallic conductor and/or N-type and P-type semiconductor thermoelectric elements assembled on a printed circuit, characterized in that it has a structure formed of:

at least one pair of laminated elements, each element being formed of a supporting layer made of polymeric material and on at least one face thereof being disposed a layer of conductive material, a layer of joining material interposed between the two laminated elements of said at least one pair for firmly connecting them one to the other, such that at least one of said layers of conductive material forms an outer layer of said pair, and in that, the printed circuit is made from the layer of conductive material of the laminated elements and electrically connects in series the thermoelectric elements to form thermoelectric couples having the hot or cold sides, respectively, on only one side of the structure, and said structure of the thermoelectric device has a spirally or circularly wound configuration.

2. Thermoelectric device according to claim 1, characterized in that each element of the at least one pair of laminated elements is formed of layer made of polymeric material and on each face thereof is disposed a layer of conductive material.

3. Thermoelectric device according to claim 1, characterized in that the supporting layer of polymeric material is formed of films without orientation or with one or two direction orientation.

4. Thermoelectric device according to claim 3, characterized in that the polymeric material which forms the supporting layer is a film made of a polymer material selected from the group consisting of polyamide, polybutilene terephtalate, polyethylene naphtalate, polycarbonate, polyamide 6, copolyamide 6-X, wherein X=6 , . . . 12, polyaryle amide MXD6, polyphenylene, polyfenylene sulphide, polycarbonate-polybutylene terepthalate copolymer, polycarbonate-polyethylene napthalate copolymer, polycarbonate-polyaryle amide copolymer, polybuthylene terephalate-polyamide or copolyamide copolymer, polyketone.

5. Thermoelectric device according to claim 1, characterized in that the material of the joining layer is formed of a thermally conductive thermosetting resin.

6. Thermoelectric device according to claim 5, characterized in that the thermosetting resin of the joining layer is selected from the group consisting of a heat conductive epoxy, acrylate or silicone resin or the like.

7. Thermoelectric device according to claim 1, characterized in that the material of the joining layer is formed of a eutectic alloy.

8. Thermoelectric device according to claim 1, characterized in that the printed circuit is formed of a single circuit which extends through out the entire length of said wound configuration.

9. Thermoelectric device according to claim 1, characterized in that the printed circuit is formed of an array of electrically separated circuits.

10. Thermoelectric device according to claim 1, characterized in that the thermoelectric device comprises a number of coils ranging form 1 to 15.

11. A solid state thermoelectric heat pump including the thermoelectric device according to claim 1, characterized in that it comprises a heat exchanger having an internal tube through which a working fluid is passed, an external tube coaxially arranged to said internal tube, the solid state thermoelectric device arranged between said internal and external tubes and in close contact thereto, end covers provided with inlet and outlet ports for the working fluid and connected in fluid communication with said internal tube, circulation means for circulating the working fluid inside the internal, turbulent flow generating means arranged inside said internal tube and adapted to generate a turbulent flow of the working fluid, electrical connector means for connecting the thermoelectric device to an external power source and temperature sensor means for sensing possible overheating at the surfaces of said internal and external tubes.

12. Heat pump according to claim 11, characterized in that cooling fins are provided on the external surface of the heat exchanger tube.

13. Heat pump according to claim 12, characterized in that it comprises fan means for generating a forced air flow throught the cooling fins of the external tube.

14. Heat pump according to claim 11, characterized in that the working fluid circulation means are provided inside one of the end covers of the heat pump.

15. Heat pump according to claim 11, characterized in that the external tube is internally provided with a hollow space through which a cooling fluid is circulated.

16. Heat pump according to claim 11, characterized in that the thermoelectric device is attached to the internal heat exchanger tube and is directly or indirectly supported thereby.

17. Heat pump according to claim 11, characterized in that the thermoelectric device directly or indirectly supports the external heat exchanger tube.

* * * * *

UNITED STATES PATENT AND TRADEMARK OFFICE
CERTIFICATE OF CORRECTION

PATENT NO. : 6,548,750 B1
DATED : April 15, 2003
INVENTOR(S) : Vicenzo Picone

It is certified that error appears in the above-identified patent and that said Letters Patent is hereby corrected as shown below:

Column 10,
Line 27, change "polyamide" to -- polyimide --.

Signed and Sealed this

Tenth Day of June, 2003

JAMES E. ROGAN
*Director of the United States Patent and Trademark Office*